United States Patent
Ihara

(10) Patent No.: US 9,385,092 B2
(45) Date of Patent: Jul. 5, 2016

(54) SEMICONDUCTOR DEVICE, ELECTRONIC DEVICE AND METHOD FOR FABRICATING THE SEMICONDUCTOR DEVICE

(71) Applicant: FUJITSU SEMICONDUCTOR LIMITED, Yokohama-shi, Kanagawa (JP)

(72) Inventor: Takumi Ihara, Tachikawa (JP)

(73) Assignee: SOCIONEXT INC., Kanagawa (JP)

( * ) Notice: Subject to any disclaimer, the term of this patent is extended or adjusted under 35 U.S.C. 154(b) by 20 days.

(21) Appl. No.: 13/972,480

(22) Filed: Aug. 21, 2013

(65) Prior Publication Data

US 2014/0084439 A1    Mar. 27, 2014

(30) Foreign Application Priority Data

Sep. 21, 2012   (JP) ................. 2012-208747

(51) Int. Cl.
| | |
|---|---|
| H01L 23/00 | (2006.01) |
| H01L 23/42 | (2006.01) |
| H01L 21/50 | (2006.01) |
| H01L 23/36 | (2006.01) |
| H01L 23/498 | (2006.01) |

(52) U.S. Cl.
CPC .............. *H01L 23/562* (2013.01); *H01L 21/50* (2013.01); *H01L 23/36* (2013.01); *H01L 23/49816* (2013.01); *H01L 2224/16225* (2013.01); *H01L 2224/32225* (2013.01); *H01L 2224/73204* (2013.01); *H01L 2224/73253* (2013.01); *H01L 2224/83101* (2013.01); *H01L 2924/15311* (2013.01)

(58) Field of Classification Search
CPC ....... H01L 23/34; H01L 23/562; H01L 21/50; H01L 23/36; H01L 23/49; H01L 2224/16225
USPC .............. 438/118; 257/689–71, 210, 723, 257/E23.08, E21.514, E23.006
See application file for complete search history.

(56) References Cited

U.S. PATENT DOCUMENTS

| | | | | |
|---|---|---|---|---|
| 5,217,922 | A * | 6/1993 | Akasaki | H01L 21/50 228/180.22 |
| 6,204,454 | B1 * | 3/2001 | Gotoh | H01L 23/10 156/153 |

(Continued)

FOREIGN PATENT DOCUMENTS

| | | |
|---|---|---|
| JP | 2004-260138 A | 9/2004 |
| JP | 2005-332970 A | 12/2005 |

(Continued)

OTHER PUBLICATIONS

English translation of FP: JP 2010113498 A.*

*Primary Examiner* — Amar Movva
*Assistant Examiner* — Sheikh Maruf
(74) *Attorney, Agent, or Firm* — Westerman, Hattori, Daniels & Adrian, LLP

(57) ABSTRACT

A semiconductor device includes a substrate, a semiconductor chip mounted on the substrate, a plate-like member that is fixed on the semiconductor chip and has a thermal expansion coefficient different from that of the substrate, and a first adhesive that is provided between the substrate and the plate-like member, the first adhesive being connected to the plate-like member and separated from the substrate, or being separated from the plate-like member and connected to the substrate.

13 Claims, 9 Drawing Sheets

(56) References Cited

U.S. PATENT DOCUMENTS

| | | | | |
|---|---|---|---|---|
| 6,344,234 | B1* | 2/2002 | Dalal | H01L 21/4853 |
| | | | | 205/125 |
| 6,504,096 | B2* | 1/2003 | Okubora | H01L 21/563 |
| | | | | 174/521 |
| 6,665,187 | B1* | 12/2003 | Alcoe | H01L 23/10 |
| | | | | 165/185 |
| 6,891,259 | B2* | 5/2005 | Im | H01L 23/16 |
| | | | | 257/687 |
| 2004/0026781 | A1* | 2/2004 | Nakai | C23C 18/54 |
| | | | | 257/737 |
| 2004/0079194 | A1* | 4/2004 | Nakata | B22F 1/0007 |
| | | | | 75/255 |
| 2004/0150118 | A1 | 8/2004 | Honda | |
| 2004/0253803 | A1* | 12/2004 | Tomono | H01L 21/563 |
| | | | | 438/614 |
| 2006/0113105 | A1 | 6/2006 | Kubo | |
| 2007/0012477 | A1* | 1/2007 | Nakamura | B23K 35/26 |
| | | | | 174/260 |
| 2007/0139892 | A1* | 6/2007 | Iijima | H01L 23/3675 |
| | | | | 361/704 |
| 2007/0200209 | A1* | 8/2007 | Fukuzono | H01L 23/42 |
| | | | | 257/675 |
| 2008/0164300 | A1* | 7/2008 | Alcoe | B23K 3/0623 |
| | | | | 228/180.22 |
| 2010/0059267 | A1* | 3/2010 | Lee | H05K 1/0271 |
| | | | | 174/268 |
| 2010/0148362 | A1* | 6/2010 | Sakurai | H01L 21/563 |
| | | | | 257/737 |
| 2010/0246152 | A1* | 9/2010 | Lin | H01L 21/563 |
| | | | | 361/783 |
| 2010/0308453 | A1* | 12/2010 | Scheid | H01L 23/3675 |
| | | | | 257/698 |
| 2011/0278715 | A1* | 11/2011 | Ihara | H01L 23/055 |
| | | | | 257/712 |
| 2012/0153448 | A1* | 6/2012 | Ihara | H01L 23/552 |
| | | | | 257/675 |
| 2013/0122656 | A1* | 5/2013 | Tomita | H01L 21/4867 |
| | | | | 438/122 |

FOREIGN PATENT DOCUMENTS

| | | | |
|---|---|---|---|
| JP | 2006-261545 A | | 9/2006 |
| JP | 2007-165433 A | | 6/2007 |
| JP | 2010113498 A | * | 5/2010 |
| WO | 2005/024940 A1 | | 3/2005 |

* cited by examiner

SEMICONDUCTOR DEVICE, ELECTRONIC DEVICE AND METHOD FOR FABRICATING THE SEMICONDUCTOR DEVICE

CROSS-REFERENCE TO RELATED APPLICATION

This application is based upon and claims the benefit of priority of the prior Japanese Patent Application No. 2012-208747, filed on Sep. 21, 2012, the entire contents of which are incorporated herein by reference.

FIELD

A certain aspect of the embodiments discussed herein is related to a semiconductor device, an electronic device and methods for fabricating these devices.

BACKGROUND

Semiconductor devices having recent increased performance and speed may employ a structure that effectively radiates heat generated in semiconductor chips to the outside. For example, it is known to provide a plate-like member having good radiation on a semiconductor chip. In order to suppress warpage of a substrate on which a semiconductor chip is mounted, there are known a structure in which a reinforcement member is provided on a substrate and another structure in a substrate and a plate-like member provided on a semiconductor chip are bonded together by a reinforcement member (see Japanese Laid-Open Patent Publication No. 2007-165433, International Publication Pamphlet No. WO2005/024940, and Japanese Laid-Open Patent Publication No. 2004-260138, for example).

In order to improve the bonding strength between a semiconductor device and a mounting board such as a mother board, an underfill agent may be injected between the semiconductor device and the mounting board. In this case, it has been proposed to provide a frame-like member on the mounting board, the frame-like member being configured to contain an underfill agent and have a seal that is provided to an opening through which the underfill agent is caused to flow out and peels off at a predetermined temperature (see Japanese Laid-Open Patent Publication No. 2006-261545, for example). According to this publication, the seal that seals the underfill agent is heated to the predetermined temperature or higher for separation, whereby the underfill agent is injected between the semiconductor device and the mounting board. It has also been proposed to use, as the underfill agent injected between the semiconductor device and the mounting device, a member having a decreased bonding strength when the member is heated to the predetermined temperature or higher (see Japanese Laid-Open Patent Publication No. 2005-332970).

SUMMARY

According to an aspect of the present invention, there is provided a semiconductor device including: a substrate; a semiconductor chip mounted on the substrate; a plate-like member that is fixed on the semiconductor chip and has a thermal expansion coefficient different from that of the substrate; and a first adhesive that is provided between the substrate and the plate-like member, the first adhesive being connected to the plate-like member and separated from the substrate, or being separated from the plate-like member and connected to the substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In the case of the semiconductor device having the structure in which the plate-like member is provided on the semiconductor chip and the substrate on which the semiconductor chip is mounted and the plate-like member are bonded together, the plate-like member and the substrate continue to be bonded together after the semiconductor device is mounted on the mounting board so that an electronic device is formed. Therefore, due to the difference in the thermal expansion coefficient between the plate-like member and the substrate, a temperature variation of the semiconductor device in use may cause a warpage in the substrate. As a result, a crack may occur in the semiconductor substrate, the semiconductor chip and a bump for mounting the semiconductor chip, and thus the reliability of the semiconductor device is degraded.

The warpage of the semiconductor device caused due to the difference in the thermal expansion coefficient between the plate-like member and the substrate (so called bimetal) applies stress solder balls for bonding the semiconductor device and the mounting device together, and causes cracks. Further, improved stiffness of the semiconductor device realized by bonding the plate-like member and the substrate together makes it difficult for the semiconductor device to follow thermal expansion and contraction of the mounting board, and causes cracks due to stress applied to the solder balls. These factors also degrade the reliability of the semiconductor device.

According to an aspect of embodiments, the reliability of semiconductor devices are improved.

Figure 1:
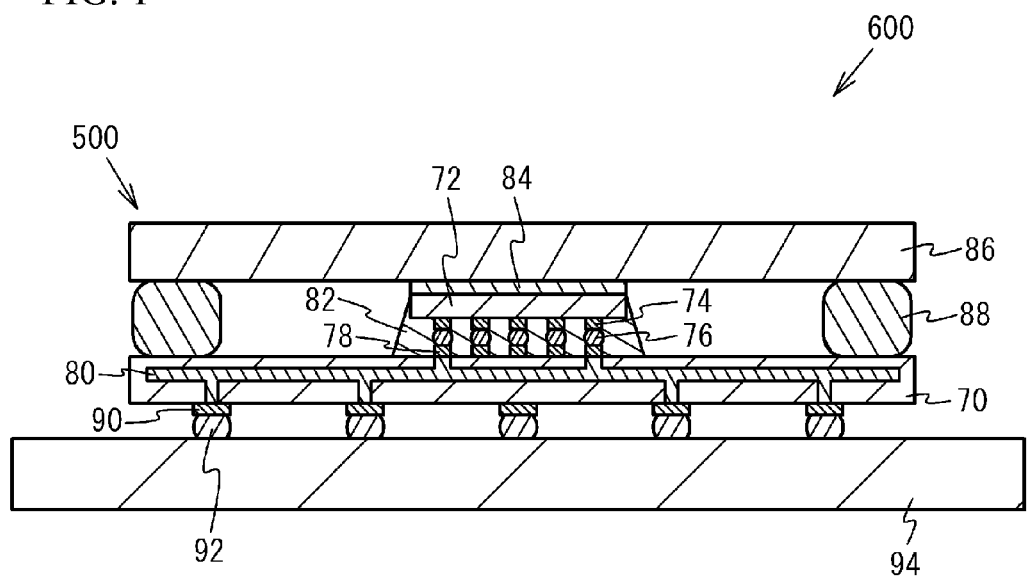
FIG. 1 is a cross-sectional view of an electronic device in which a semiconductor device in accordance with a first comparative example is mounted.

Now, a description is given of an electronic device in accordance with a first comparative example. FIG. 1 is a cross-sectional view of an electronic device in which a semiconductor device is mounted in accordance with the first comparative example. Referring to FIG. 1, a semiconductor chip 72 is mounted on a substrate 70, which is an organic-system interconnection substrate, for example. The semiconductor chip 72 is mounted on the substrate 70 in such a manner that a solder bump 76 provided on a chip-side electrode pads 74 is bonded to a substrate-side electrode pad 78. With this manner, the semiconductor chip 72 is electrically connected to interconnection line 80 within the substrate 70.

An underfill agent 82 is provided between the semiconductor chip 72 and the substrate 70. A plate-like member 86 made of a metal is fixed to the top of the semiconductor chip 72 so that a heat conductive adhesive 84 having good heat conductivity is interposed between the substrate 70 and the semiconductor chip 72. Since the substrate 70 is an organic-system substrate and the plate-like member 86 is made of a metal, the plate-like member 86 and the substrate 70 have mutually different thermal expansion coefficients. An adhesive 88 that bonds the plate-like member 86 and the substrate 70 together is interposed between the plate-like member 86 and the substrate 70. On the lower surface of the substrate 70, a solder ball 92 is mounted on a ball pad 90 electrically connected to the interconnection line 80. A semiconductor device 500 of the first comparative example having the above-described structure is mounted on a mounting board 94 such as a mother board by the solder ball 92, and an electronic device 600 is thus formed.

Figure 2:
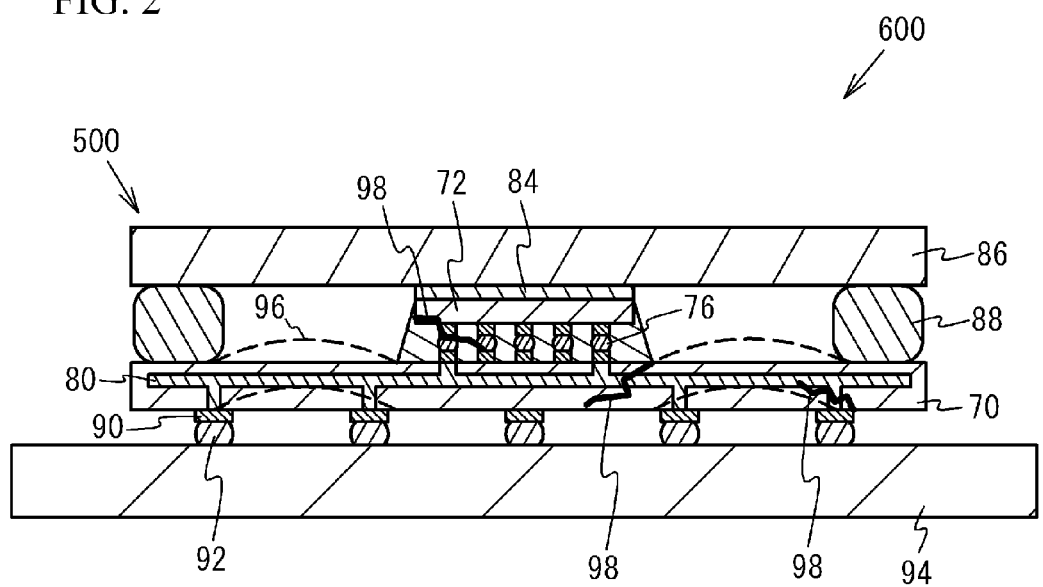
FIG. 2 is a diagram that describes problems that occur in the electronic device in which the semiconductor device of the first comparative example is mounted.

FIG. 2 is a diagram that explains a problem caused in the electronic device in which the semiconductor device is mounted in accordance with the first comparative example. Referring to FIG. 2, since the plate-like member 86 and the substrate 70 are bonded together by the adhesive 88, a variation in the temperature of the electronic device 600 in use may cause bends of the substrate 70 horizontally located between the semiconductor chip 72 and the adhesive 88. This results from the different thermal expansion coefficients between the substrate 70 and the plate-like member 86. For example, in a case where the thermal expansion coefficient of the plate-like member 86 is smaller than that of the substrate 70, when the electronic device 600 is at high temperature, the degree of expansion of the substrate 70 is larger than that of the plate-like member 86. However, since the substrate 70 is bonded to the plate-like member 86, upward bends 96 as indicated by broken lines in FIG. 2 occur. The upward bends 96 are more likely to occur when the substrate 70 is made of a soft material such as an organic-system substrate. Variations in the temperature of the electronic device 600 cause the upward bends 96 to occur repeatedly. As a result, cracks 98 as indicated by bold lines in FIG. 2 occur, and may break the interconnection line 80. Further cracks 98 may occur in the semiconductor chip 72 or any of the solder bumps 76. Thus, the reliability of the semiconductor device 500 is degraded.

Since the plate-like member 86 and the substrate 70 have the mutually different thermal expansion coefficients, a warpage occurs in the semiconductor device 500 by the difference in the thermal expansion coefficient (so-called bimetal). Thus, stress is applied to the solder ball 92 that bond the semiconductor device 500 and the mounting board 94 together, and causes cracks in the semiconductor device 500.

Since the plate-like member 86 and the substrate 70 are bonded together, the stiffness of the semiconductor device 500 is improved. It is therefore difficult for the semiconductor device 500 to follow the thermal expansion and contraction of the mounting board 94, and cracks are thus caused due to stress applied to the solder ball 92. These factors also degrade the reliability of the semiconductor device.

Now, a description is given of embodiments capable of solving these problems and improving the reliability of the semiconductor device.

First Embodiment

Figure 3A:
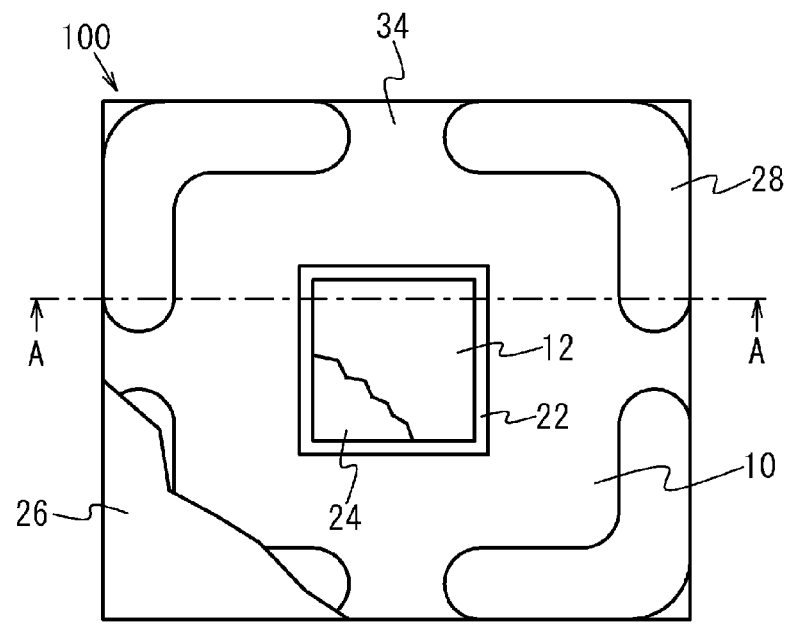
FIG. 3A is a top view of a semiconductor device in accordance with a first embodiment.
Figure 3B:
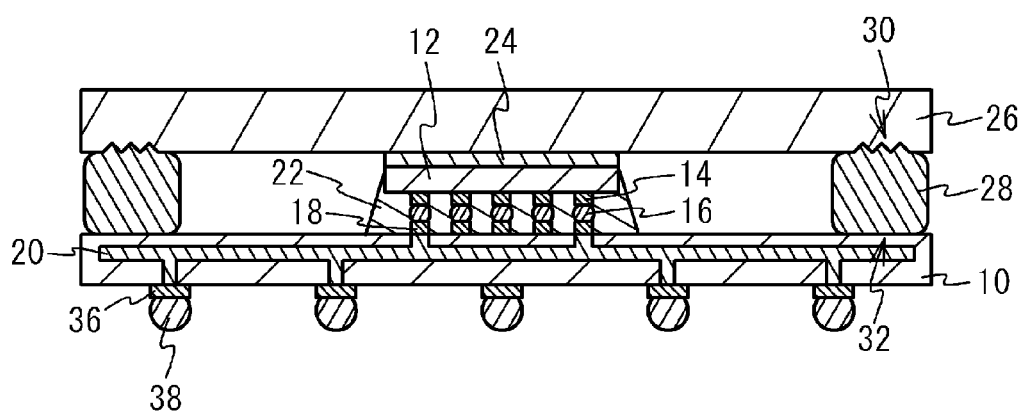
FIG. 3B is a cross-sectional view taken along a line A-A in FIG. 3A.

FIG. 3A is a top view of a semiconductor device in accordance with a first embodiment, and FIG. 3B is a cross-sectional view taken along a line A-A in FIG. 3A. The view of FIG. 3A is seen through parts of a plate-like member 26 and a heat conductive adhesive 24. Referring to FIGS. 3A and 3B, a semiconductor device 100 of the first embodiment is structured to have a semiconductor chip 12 mounted on a substrate 10. The semiconductor chip 12 is mounted on the substrate 10 by bonding a bump 16 provided on a chip-side electrode pad 14 made of a metal to a substrate-side electrode pad 18 made of a metal. The bump 16 is a solder bump, for example. The semiconductor chip 12 is flip-chip mounted on the substrate in a facedown manner.

The substrate 10 is a stacked-layer interconnection substrate in which organic-system substrates such as epoxy resin or polyimide resin are stacked, and an interconnection line 20 are formed within the substrate. The bonding of the bump 16 on the chip-side electrode pad 14 to the substrate-side electrode pads 18 makes an electric connection between the semiconductor chip 12 and the interconnection line 20.

An underfill agent 22 such as epoxy resin is provided between the semiconductor chip 12 and the substrate 10. The head conductive adhesive 24 having a good heat conductivity is provided on the semiconductor chip 12. The plate-like member 26 made of a metal such as copper or aluminum is provided on the heat conductive adhesive 24. The heat conductive adhesive 24 fixes the plate-like member 26 to the top of the semiconductor chip 12. For example, the substrate 10 is an organic-system substrate and the plate-like member 26 is made of a metal. Therefore, the substrate 10 and the plate-like member 26 have mutually different thermal expansion coefficients. Since the heat conductive adhesive 24 has a good heat conductivity, heat generated in the semiconductor chip 12 is radiated to the plate-like member 26 through the heat conductive adhesive 24. As described above, the plate-like member 26 functions as a heat radiating plate that radiates heat generated in the semiconductor chip 12. Further, the plate-like member 26 has the function of protecting the semiconductor chip 12 from external shock. The heat conductive adhesive 24 may be silicone-based heat conductive adhesive or solder, for example.

A first adhesive 28 for bonding the plate-like member 26 and the substrate 10 together is provided between the plate-like member 26 and the substrate 10. That is, the plate-like member 26 and the substrate 10 are unified by the first adhesive 28. The plate-like member 26 has a rough surface 30. The first adhesive 28 adheres to the rough surface 30. The substrate 10 has an even surface 32 having a smaller roughness than the rough surface 30. The first adhesive 28 adheres to the corresponding even surface 32. Thus, the adhesion area between the first adhesive 28 and the substrate 10 is smaller than that between the first adhesive 28 and the plate-like member 26.

The first adhesive 28 has a property of separation at a predetermined temperature. For example, the first adhesive 28 may be Ecosepara (registered trademark) of KAKEN TECH Co., Ltd. The first adhesive 28 is provided so as to have an L shape in a corner portion of the substrate 10 having a rectangular shape and is arranged so that adjacent first adhesives 28 are separated from each other. This arrangement results in an opening 34 between the adjacent first adhesives 28. The opening 34 functions to discharge gas generated from the underfill agent 22 and the heat conductive adhesive 24 to the outside.

On the lower surface of the substrate 10, a solder ball 38 is mounted on a ball pad 36 made of a metal electrically connected to the interconnection line 20. The solder ball 38 has a melting point lower than the predetermined temperature at which the first adhesive 28 is separated. For example, when the first adhesive 28 is Ecosepara CT-2680M and CT-2681H of KAKEN TECH Co., Ltd., the separation temperature of the first adhesive 28 is 200° C., and therefore the solder ball 38 has a melting point lower than 200° C. In this case, the solder ball 38 may be a Sn—Bi based solder ball (having a melting point of around 139° C.) or a Sn—Pb based solder ball (having a melting point of around 182° C.).

Figure 4A:
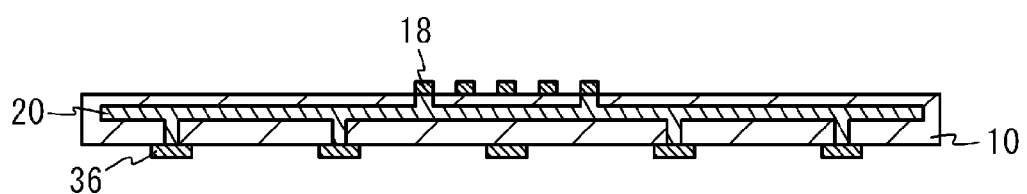
FIG. 4A through 4C are cross-sectional views that describe a method for fabricating the semiconductor device in accordance with the first embodiment.

FIGS. 4A through 4C and FIGS. 5A through 5C are cross-sectional views that illustrate a method for fabricating the semiconductor device in accordance with the first embodiment. FIG. 4A illustrates a step of preparing the substrate 10 having the upper surface on which the substrate-side electrode pad 18 is provided, the lower surface on which the ball pad 36 is provided, and the interconnection line 20 that is provided within the substrate 10 and electrically interconnects the substrate-side electrode pad 18 and the corresponding ball pad 36.

Figure 4B:
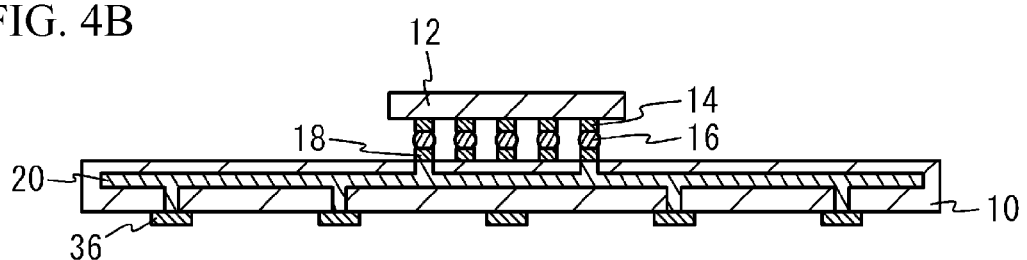
Figure 4C:
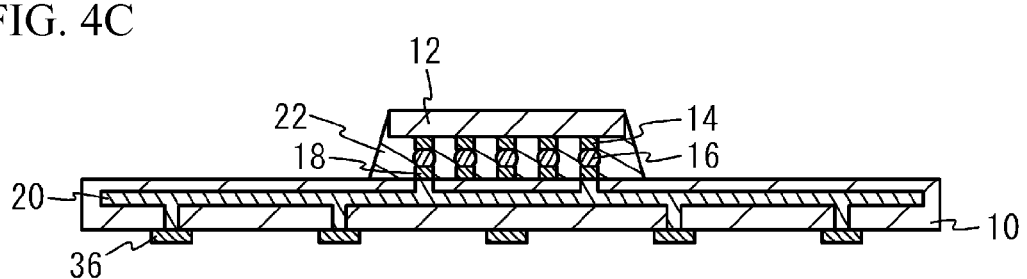

Referring to FIG. 4B, the semiconductor chip 12 is mounted on the substrate 10. The mounting of the semiconductor chip 12 is implemented by aligning the bump 16 on the chip-side electrode pad 14 with the substrate-side electrode pad 18 and heating the bump 16 for melting so as to bond the bump 16 to the substrate-side electrode pad 18. For example, the bump 16 is a solder bump and is heated to 200 to 300° C. Since there is a difference in the thermal expansion coefficient between the semiconductor chip 12 and the substrate 10, the heating of the bump 16 causes a warpage of the substrate 10 and the semiconductor chip 12. In an exemplary case where the semiconductor chip 12 is a silicon-based semiconductor chip and the substrate 10 is an organic-system substrate such as epoxy resin or polyimide resin, the thermal expansion coefficient of silicon is approximately 3.3 ppm/K, and that of epoxy and polyimide is approximately 20 to 70 ppm/K. Thus, the above difference results in a concave warpage in the substrate 10. After the semiconductor chip 12 is mounted, as illustrated in FIG. 4C, the underfill agent 22 is injected between the semiconductor chip 12 and the substrate 10 and is hardened.

Figure 5A:
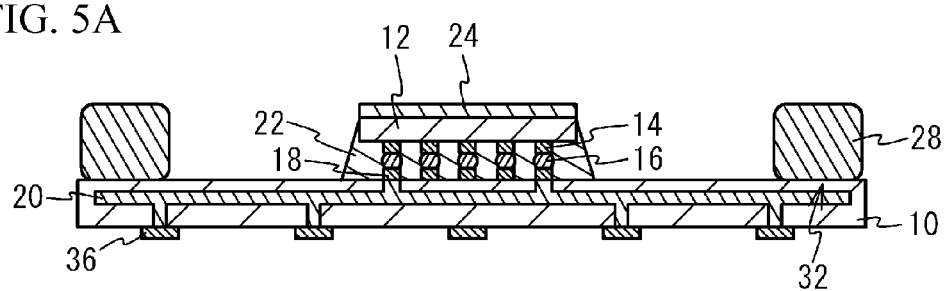
FIGS. 5A through 5C are cross-sectional views that describe steps of the fabrication method that follow those of FIGS. 4A through 4C.

Referring to FIG. 5A, the heat conductive adhesive 24 is provided on the semiconductor chip 12. The first adhesive 28 that is separated at the predetermined temperature is provided on the substrate 10. In order to reduce the adhesion area between the substrate 10 and the first adhesive 28, if there is a large roughness on the substrate 10, the surface of the substrate 10 is polished by a plasma process or with a polishing paper having a fine grade and a polishing agent until the even surface 32 having a small roughness are obtained. After the even surface 32 is formed, the first adhesive 28 is provided on the even surface 32. For example, the heat conductive adhesive 24 may be silicone-based heat conductive adhesive (having hardening conditions of 150° C. and 0.5 hours, for example), or an In—Ag based solder (having a melting temperature range of 144° C. to 153° C., for example). For example, the first adhesive 28 may be Ecosepara CT-2680M and CT-2681H (having hardening conditions of 50° C. and 1 hour or more) of KAKEN TECH Co., Ltd. It is to be noted that at this stage, the heat conductive adhesive 24 and the first adhesive 28 are merely provided on the semiconductor chip 12 and the substrate 10, respectively, and the heat conductive adhesive 24 and the first adhesive 28 have not yet been heated. That is, the heat conductive adhesive 24 has not adhered to the semiconductor chip 12, and the first adhesive 28 has not adhered to the substrate 10.

Figure 5B:
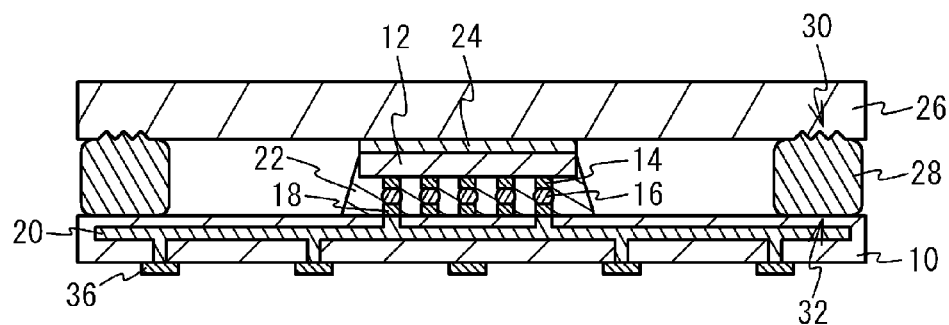

As illustrated in FIG. 5B, the plate-like member 26 is provided on the heat conductive adhesive 24 and the first adhesive 28 so as to connect these adhesives. The rough surface 30 of the plate-like member 26 is formed so that the adhesion area between the first adhesive 28 and the plate-like member 26 is larger than that between the first adhesive 28 and the substrate 10, and is arranged on the first adhesive 28. The rough surface 30 may be formed by grinding the plate-like member 26 or polishing the same roughly. If the plate-like member 26 is formed by using a mold, the mold may have a roughness for forming the rough surfaces 30 on the plate-like member 26.

The heat conductive adhesive 24 and the first adhesive 28 on which the plate-like member 26 is arranged are then heated so that the heat conductive adhesive 24 is hardened or melted and the first adhesive 28 is hardened. This heating process is carried out at a temperature lower than the predetermined temperate at which the first adhesive 28 is separated in order to maintain the adhesiveness of the first adhesive 28. For example, in the case of using Ecosepara CT-2680M and CT-2681H for the first adhesive 28, the separation temperature of the first adhesive 28 is 200° C., and therefore, the adhering process for the heat conductive adhesive 24 and the first adhesive 28 is carried out at a temperature lower than 200° C. For example, the heat conductive adhesive 24 and the first adhesive 28 are heated at 150° C. for 1 hour, whereby the heat conductive adhesive 24 adheres to the semiconductor chip 12 and the plate-like member 26. As a result, the plate-like member 26 is fixed to the top of the semiconductor chip 12. Simultaneously, the first adhesive 28 adheres to the substrate 10 and the plate-like member 26, whereby the substrate 10 and the plate-like member 26 are bonded together. As has been described with reference to FIG. 4B, a warpage occurs in the substrate 10. However, the heating at 150° C. causes an inverse warpage in the substrate 10, which is then bonded to the plate-like member 26. Therefore, the warpage of the substrate 10 is reduced. The corners of the substrate 10 having a rectangular shape are likely to be warped. It is therefore preferable that the first adhesive 28 is provided in the corner portion of the substrate 10 for the purpose of reducing the warpage of the substrate 10, as illustrated in FIG. 3A.

Figure 6:
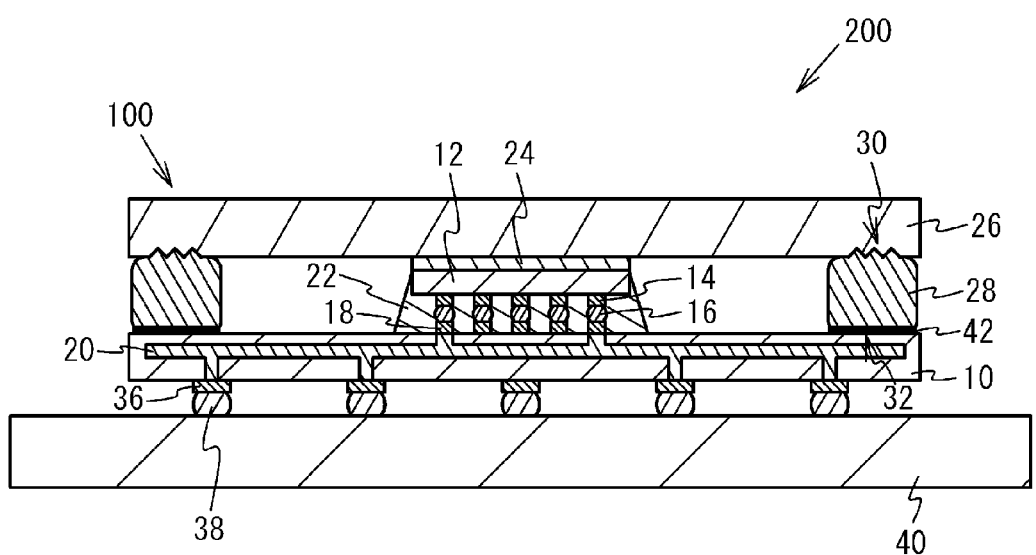
FIG. 6 is a method that illustrates a method for fabricating an electronic device in which the semiconductor device in accordance with the first embodiment is mounted.

For example, in a case where the substrate 10 and the plate-like member 26 are not bonded together by the first adhesive 28, the substrate 10 remains warped considerably. In this case, the solder ball 38 may be mounted inappropriately or the semiconductor device 100 may be mounted erroneously on a mounting board 40 (FIG. 6). On the contrary, the use of the first adhesive 28 used for bonding the substrate 10 and the plate-like member 26 together reduces the warpage of the substrate 10, and the occurrence of the above failures is suppressed.

The heating of the heat conductive adhesive 24 and the first adhesive 28 is not limited to heating at a temperature at which both the heat conductive adhesive 24 and the first adhesive 28 adhere to the plate-like member 26, but may be heating at temperatures at which the heat conductive adhesive 24 and the first adhesive 28 adhere to the plate-like member 26 in order or at different timings. For example, the heat conductive adhesive 24 and the first adhesive 28 are heated at 150° C. for 0.5 hours, whereby the heat conductive adhesive 24 adheres to the semiconductor chip 12 and the plate-like member 26. Thereafter, the first adhesive 28 is heated at 50° C. for 0.5 hours, whereby the first adhesive 28 adheres to the substrate 10 and the plate-like member 26.

Figure 5C:
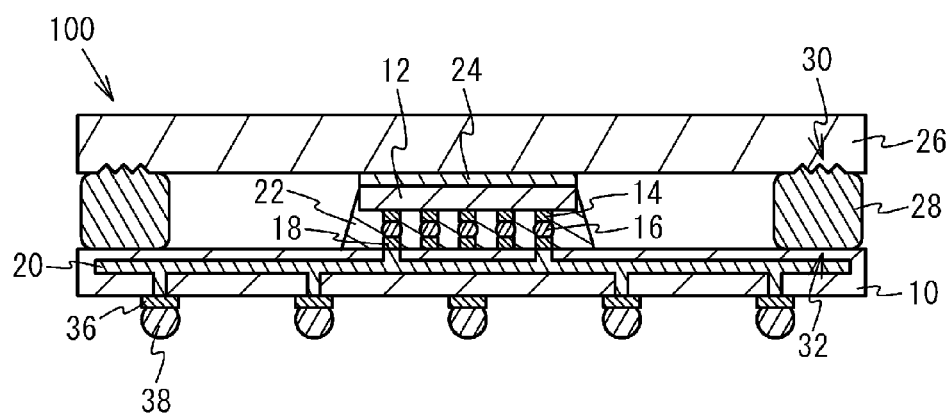

Referring to FIG. 5C, the solder ball 38 is mounted on the ball pad 36 on the lower surface of the substrate 10. The solder ball 38 has a melting point lower than the separation temperature of the first adhesive 28 in order to avoid the separation of the first adhesive 28 in the mounting of the solder ball 38. The semiconductor device 100 illustrated in FIG. 5C is obtained through the above steps.

FIG. 6 is a cross-sectional view that illustrates a method for fabricating an electronic device in which the semiconductor device in accordance with the first embodiment is mounted. Referring to FIG. 6, the semiconductor device 100 is mounted on the mounting board 40, which may be a mother board or the like. Then, the solder ball 38 is melted and is bonded to the mounting board 40. Since the melting point of the solder ball 38 is lower than the separation temperature of the first adhesive 28, at this stage, the first adhesive 28 remains in the state of adhering to both the substrate 10 and the plate-like member 26. After that, the first adhesive 28 is heated to the predetermined temperature at which the first adhesive 28 is separated (for example, 200° C.) or higher for the purpose of separating the first adhesive 28. Since the first adhesive 28 adheres to the substrate 10 with a smaller adhesion area than that with which the first adhesive 28 adheres to the plate-like member 26, the first adhesive 28 is separated from the substrate 10, while remaining in the state of adhering to the plate-like member 26. In FIG. 6, there is illustrated a separated portion 42 in which the first adhesive 28 is separated from the substrate 10. The separated portion 42 may be a gap between the first adhesive 28 and the substrate 10, or may be a simple contact between the first adhesive 28 and the substrate 10. Through the above process, an electronic device 200 in which the semiconductor device 100 of the first embodiment is mounted is available.

As described above, according to the first embodiment, the first adhesive 28 that bonds the substrate 10 and the plate-like member 26 together and is separated at the predetermined temperature is provided between the substrate 10 and the plate-like member 26 having a thermal expansion coefficient different from that of the substrate 10. With the first adhesive 28, as illustrated in FIG. 6, the first adhesive 28 may be separated from the substrate 10 by heating the first adhesive 28 to the separation temperature of the first adhesive 28 after the semiconductor device 100 is mounted on the mounting board 40. That is, the substrate 10 and the plate-like member 26 are released from the bonding state. Therefore, the substrate 10 and the plate-like member 26 are allowed to expand with the respective thermal expansion coefficients in response to temperature variations in use of the electronic device 200. It is therefore possible to suppress the occurrence of bends of the substrate 10 as has been described with reference to FIG. 2. Further, since the substrate 10 and the plate-like member 26 are not bonded together, the warpage of the semiconductor device 100 due to bimetal is suppressed and the stiffness of the semiconductor device 100 is weakened. Thus, the semiconductor device 100 is more likely to follow the thermal expansion and contraction of the mounting board 40. Therefore, stress load on the solder ball 38 is reduced. According to the first embodiment, the reliability of the semiconductor device 100 is improved.

As has been described with reference to FIG. 5B, in order to reduce the warpage of the substrate 10, the substrate 10 and the plate-like member 26 are bonded together by the first adhesive 28. This arrangement aims at suppressing the inappropriate mounting of the solder ball 38 and the erroneous mounting of the semiconductor device 100 on the mounting board 40. That is, it is preferable that the substrate 10 and the plate-like member 26 are bonded together by the first adhesive 28 until the semiconductor device 100 is mounted on the mounting board 40. From the above viewpoint, as has been described with reference to FIG. 5B, the plate-like member 26 that is fixed to the top of the semiconductor chip 12 and is bonded to the substrate 10 by the first adhesive 28 is formed at the temperature at which the adhesiveness of the first adhesive 28 is maintained. Further, as has been described with reference to FIG. 5C, the solder ball 38 having a melting temperature lower than the separation temperature of the first adhesive 28 is mounted in order to avoid the separation of the first adhesive 28 in the process of mounting the solder ball 38.

As illustrated in FIG. 6, it is preferable that the first adhesive 28 is separated from either the substrate 10 or the plate-like member 26 and are kept adhesive to the other after the semiconductor device 100 is mounted on the mounting board 40. Thus, the first adhesive 28 remains between the substrate 10 and the plate-like member 26, and suppresses tilts of the plate-like member 26. For example, in a case where the first adhesive 28 is separated from both the substrate 10 and the plate-like member 26 and the first adhesive 28 does not exist between the substrate 10 and the plate-like member 26, the plate-like member 26 is tilted due to an external shock and the semiconductor chip 12 may be damaged. In contrast, according to the first embodiment, the first adhesive 28 remains between the substrate 10 and the plate-like member 26, and therefore suppress the tilts of the plate-like member 26. Thus, the semiconductor chip 12 is protected from external shocks.

The first adhesive 28 is separated from either the substrate 10 or the plate-like member 26 and remains in the state of adhering to the other. It is therefore desirable that that the adhesion area between the first adhesive 28 and the substrate 10 and that between the first adhesive 28 and the plate-like member 26 differ from each other. In order to realize the different adhesion areas, according to the first embodiment, the plate-like member 26 has the rough surface 30 to which the first adhesive 28 adheres, and the substrate 10 has the even surface 32 to which the first adhesive 28 adheres. However, the different adhesion areas may be realized by another manner.

Figure 7A:
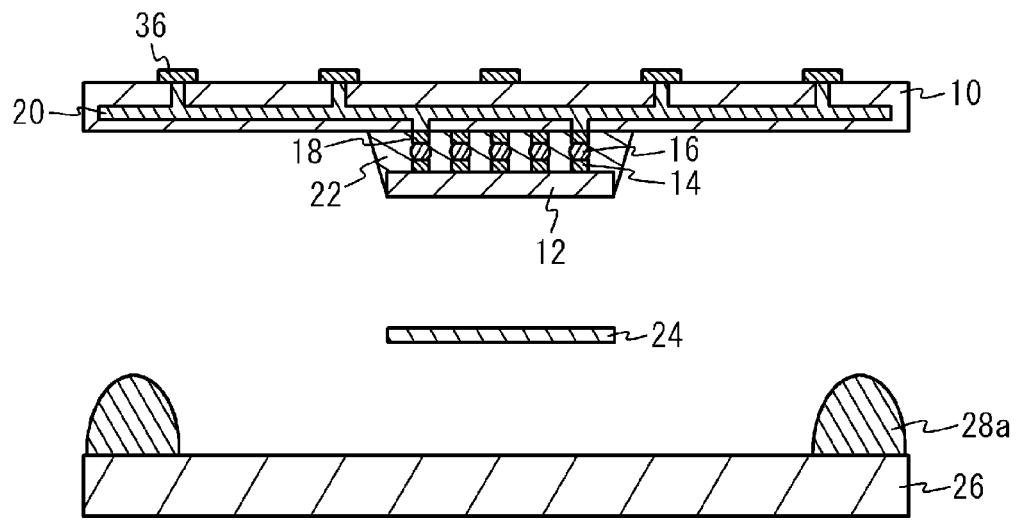
FIGS. 7A and 7B are diagrams that illustrate a first variation of the first adhesive.
Figure 7B:
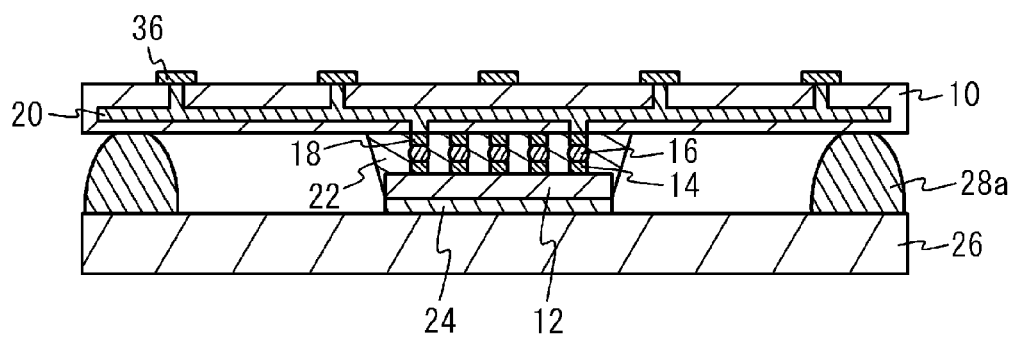

FIGS. 7A and 7B are diagrams of a first variation of the first adhesive 28. Referring to FIG. 7A, a first adhesive 28a provided on the plate-like member 26 has a dome shape having a round top and a decreasing width toward the top from the side on which the plate-like member 26 is provided. The first adhesive 28a thus shaped may be formed by surface tension in coating. As illustrated in FIG. 7B, the adhesion area between the first adhesive 28a and the substrate 10 may be made smaller than that between the first adhesive 28a and the plate-like member 26 by appropriately selecting the interval between the substrate 10 and the plate-like member 26 and the height of the first adhesive 28a. Thus, the first adhesive 28a may be separated from the substrate 10, while remaining in the state of adhering to the plate-like member 26.

Figure 8A:
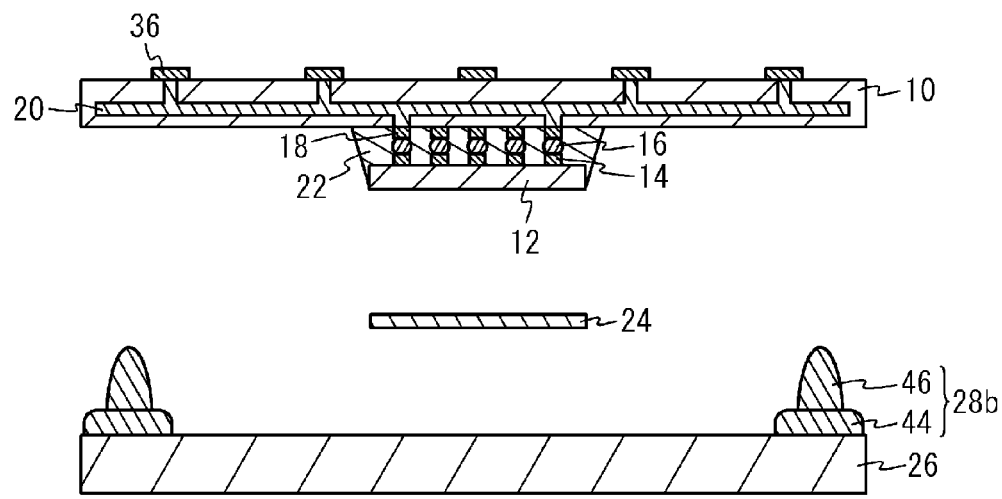
FIGS. 8A and 8B are diagrams that illustrate a second variation of the first adhesive.
Figure 8B:
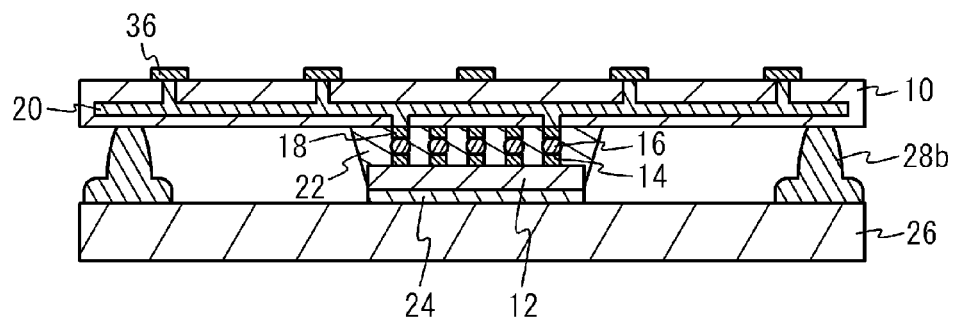

FIGS. 8A and 8B are diagrams of a second variation of the first adhesive 28. Referring to FIG. 8A, a first adhesive 28b provided on the plate-like member 26 has a two-stage structure composed of a lower portion 44 having a large horizontal width and an upper portion 46 having a smaller horizontal width than that of the lower portion 44. That is, the first adhesive 28b has a decreasing width toward the top from the side on which the plate-like member 26 is provided. The first adhesive 28b thus shaped may be formed by performing coating twice (so-called two coats). The first adhesive 28b is suitable for a material having a high viscosity. Referring to FIG. 8B, the adhesion area between the first adhesive 28b and the substrate 10 may be made smaller than that between the first adhesive 28b and the plate-like member 26 by appropriately selecting the interval between the substrate 10 and the plate-like member 26 and the height of the first adhesive 28b. Thus, the first adhesive 28b may be separated from the substrate 10, while remaining in the state of adhering to the plate-like member 26.

In the first embodiment, the first adhesive 28 is arranged to have the adhesion area to the substrate 10 smaller than that to the plate-like member 26. However, the inverse relation may be used. That is, the first adhesive 28 may have the adhesion area to the substrate 10 larger than that to the plate-like member 26. Therefore, the first adhesive 28 adheres to the rough surface 30 formed on either the substrate 10 or the plate-like member 26 and the even surface 32 formed on the other. In the foregoing, the first adhesive 28 is separated at the predetermined temperature. However, the first adhesive 28 may be separated from the substrate 10 or the plate-like member 26 under a predetermined condition other than the above. For example, the first adhesive 28 may be made of a material that is separated by current that flows therethrough.

Figure 9:
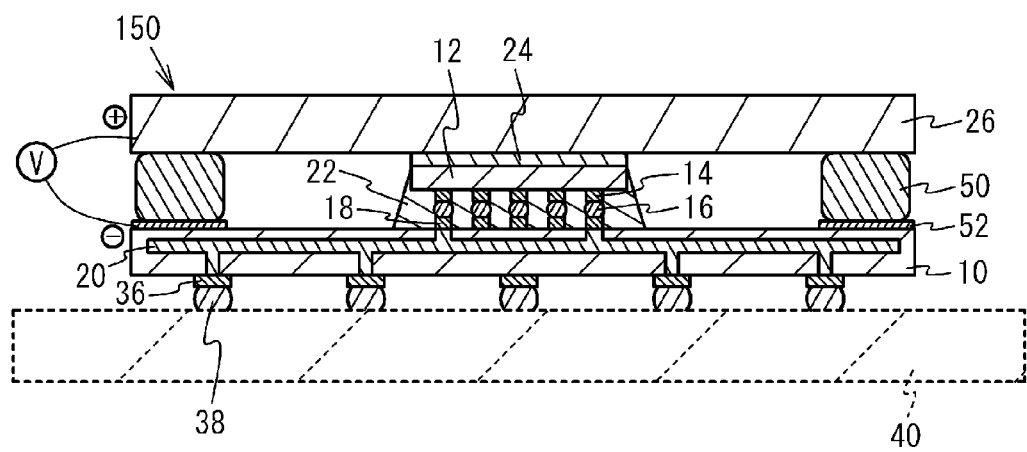
FIG. 9 is a cross-sectional view of a semiconductor device with adhesive that is separated by current that flow through the adhesives.

FIG. 9 is a cross-sectional view of a semiconductor device 150 with an adhesive that is separated by current flowing therethrough. Referring to FIG. 9, a first adhesive 50 is provided between the substrate 10 and the plate-like member 26 in order to bond the substrate 10 and the plate-like member 26 together. The first adhesive 50 is separated when current flows through the first adhesive 50. The first adhesive 50 adheres to a metal pattern 52 made of copper or the like provided on the substrate 10. The other structures of the semiconductor device 150 are substantially the same as those of the first embodiment illustrated in FIG. 3B, and a description thereof is omitted here. After the semiconductor device 150 is mounted on the mounting board 40, a voltage is applied between the plate-like member 26 and the metal pattern 52 to cause a current to flow through the first adhesive 50, which is thus separated on the positive or negative side.

In order to realize the different adhesion areas to the first adhesive 28, according to the first embodiment, the rough surface 30 is formed on the plate-like member 26 by roughness making process, and the even surface 32 is formed on the substrate 10 by the planarizing process. However, if the plate-like member 26 and the substrate 10 have originally different surface conditions, the above processes may be omitted. In the foregoing, the plate-like member 26 is made of a metal, and is fixed to the top of the semiconductor chip 12 by the heat conductive adhesive 24. However, if the radiation of heat generated by the semiconductor chip 12 is not considered, the plate-like member 26 can be made of a material other than a metal. When the thermal expansion coefficient of the plate-like member 26 is merely different from that of the substrate 10, the problems that have been described with reference to FIG. 2 occur. It is therefore preferable that the first adhesive 28 that is separated under the predetermined condition is provided between the substrate 10 and the plate-like member 26.

Second Embodiment

Figure 10A:
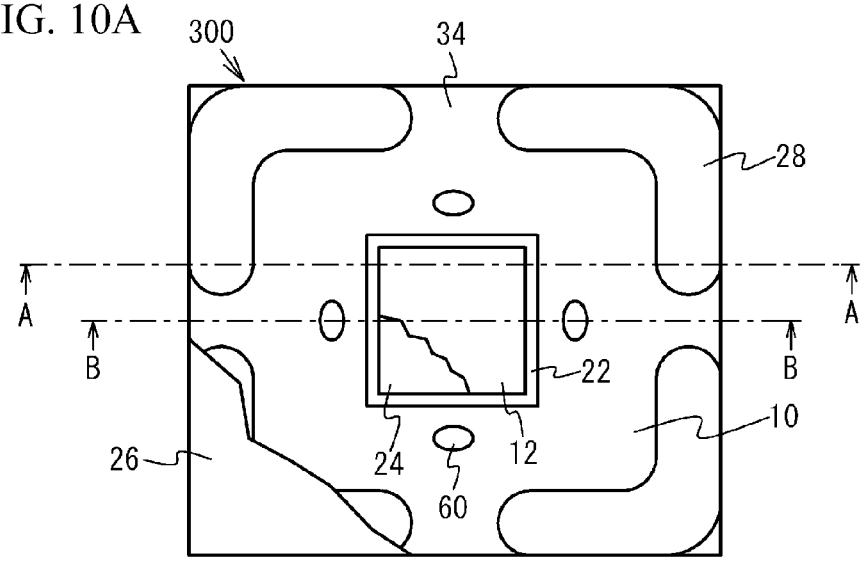
FIG. 10A is a top view of a semiconductor device in accordance with a second embodiment.
Figure 10B:
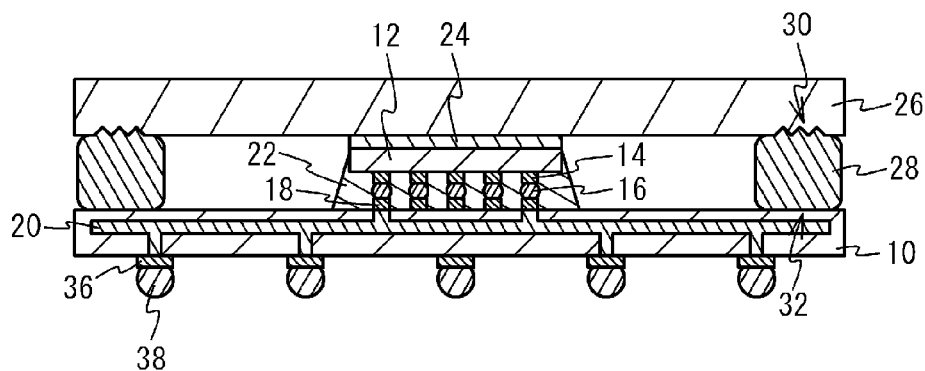
FIG. 10B is a cross-sectional view taken along a line A-A in FIG. 10A.
Figure 10C:
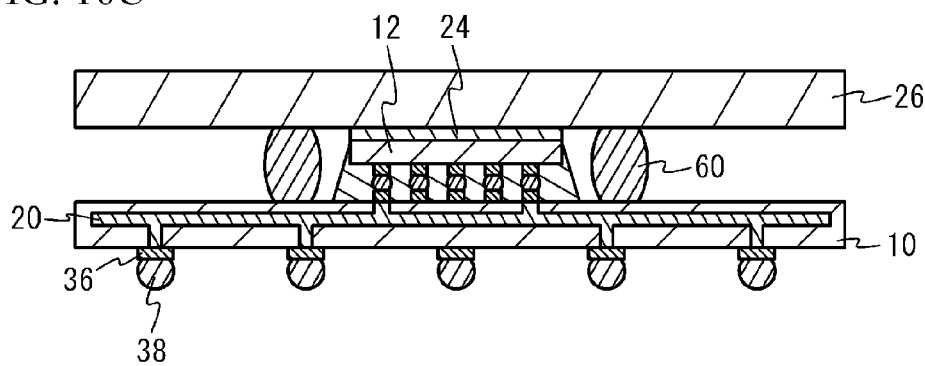
FIG. 10C is a cross-sectional view taken along a line B-B in FIG. 10A.

FIG. 10A is a top view of a semiconductor device in accordance with a second embodiment, FIG. 10B is a cross-sectional view taken along a line A-A in FIG. 10A, and FIG. 10C is a cross-sectional view taken along a line B-B in FIG. 10A. Referring to FIGS. 10A through 10C, a semiconductor device 300 of the second embodiment differs from the semiconductor device 100 in that second adhesive 60 is provided between the plate-like member 26 and the substrate 10 in addition to the first adhesive 28. That is, the plate-like member 26 and the substrate 10 are bonded together by the first adhesive 28 and the second adhesive 60. The second adhesive 60 has an area for adhering to the substrate 10 and the plate-like member 26 smaller than that of the first adhesive 28. The second adhesive 60 is arranged closer to the center of the substrate 10 than the first adhesive 28. The second adhesive 60 continues to bond the plate-like member 26 and the substrate 10 together even at the temperature at which the first adhesive 28 is separated from the substrate 10. The other structures of the semiconductor device 300 are the same as those of the first semiconductor device 100, and a description thereof is omitted here.

As illustrated in FIG. 6, in the first embodiment, if the first adhesive 28 is separated by heating the first adhesive 28 to the predetermined temperature (separation temperature), the separated portion 42 occurs between the substrate 10 and the first adhesive 28. The separated portion 42 may result in a gap between the substrate 10 and the first adhesive 28. In this case, if an external shock is applied to the plate-like member 26, the plate-like member 26 may be titled in any way, and the semiconductor chip 12 may be damaged. In contrast, the second embodiment employs the second adhesive 60 that continues to bond the substrate 10 and the plate-like member 26 together even at the temperature at which the first adhesive 28 is separated. It is thus possible to suppress the tilt of the plate-like member 26. That is, the semiconductor chip 12 is protected from the external shock.

As illustrated in FIGS. 10A through 10C, it is preferable that the second adhesive 60 has a smaller adhesion area with respect to the substrate 10 and the plate-like member 26 than that of the first adhesive 28. If the adhesion area of the second adhesive 60 is comparatively large, the second embodiment will have problems such as a bend of the substrate 10, a warpage of the semiconductor device 300, and cracks in the substrate 10 and the solder ball 38 due to an increase in the stiffness of the semiconductor device 300, as has been described with reference to FIG. 2. It is preferable that the second adhesive 60 is provided closer to the center of the substrate 10 than the first adhesive 28 (or closer to the semiconductor chip 12), as illustrated in FIG. 10A. With this arrangement, the bend of the substrate is suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:
1. A semiconductor device comprising:
   a substrate;
   a semiconductor chip mounted on the substrate;
   a plate-like member that is fixed on the semiconductor chip and has a thermal expansion coefficient different from that of the substrate; and a first adhesive that is provided between the substrate and the plate-like member, a whole of the first adhesive being separated from the semiconductor chip, and the whole of the first adhesive being located around the semiconductor chip in a plan view, wherein a whole upper surface of the first adhesive is directly adhered to the plate-like member, a whole lower surface of the first adhesive is not fixed to the substrate and other adhesive member is not provided between the whole lower surface of the first adhesive and the substrate, or a whole upper surface of the first adhesive is not fixed to the plate-like member, the other adhesive member is not provided between the whole upper surface of the first adhesive and the plate-like member and a whole lower surface of the first adhesive is directly adhered to the substrate.

2. The semiconductor device according to claim 1, wherein the first adhesive is separated from the substrate or the plate-like member at a first temperature.

3. The semiconductor device according to claim 1, wherein the first adhesive is separated from the substrate or the plate-like member by a current flow through the first adhesive.

4. The semiconductor device according to claim 1, wherein an area of the upper surface is different from an area of the lower surface.

5. The semiconductor device according to claim 1, wherein a first roughness of a part of the substrate which faces the lower surface of the first adhesive is different from a second roughness of a part of the plate-like member which faces the upper surface of the first adhesive.

6. The semiconductor device according to claim 5, wherein the second roughness is larger than the first roughness, the first adhesive is not fixed to the substrate, and the first adhesive is directly adhered with the plate-like member.

7. The semiconductor device according to claim 1, wherein the first adhesive has a shape having a decreasing width from one of the substrate and the plate-like member toward the other.

8. The semiconductor device according to claim 1, further comprising a second adhesive provided between the semiconductor chip and the first adhesive in a plan view, that contacts with the substrate and the plate-like member.

9. The semiconductor device according to claim 8, wherein the second adhesive is smaller than the first adhesive in a plan view.

10. The semiconductor device according to claim 8, wherein the second adhesive is nearer to the semiconductor chip than the first adhesive.

11. The semiconductor device according to claim 1, wherein the first adhesive is provided so as to form a gap between the first adhesive and the substrate or between the first adhesive and the plate-like member.

12. The semiconductor device according to claim 1, wherein the substrate has a rectangular shape, a plurality of the first adhesives are provided in corner portions of the substrate respectively, and the first adhesives are separated from each other.

13. The semiconductor device according to claim 1, further comprising a solder ball on the surface, that is on the other side semiconductor chip mounted on the substrate, wherein the solder ball has a melting point lower than the first temperature.

* * * * *